United States Patent [19]

Lewis

[11] Patent Number: 4,771,321

[45] Date of Patent: Sep. 13, 1988

[54] HIGH CONDUCTANCE OHMIC JUNCTION FOR MONOLITHIC SEMICONDUCTOR DEVICES

[75] Inventor: Carol R. Lewis, Palo Alto, Calif.

[73] Assignee: Varian Associates, Inc., Palo Alto, Calif.

[21] Appl. No.: 15,538

[22] Filed: Feb. 13, 1987

Related U.S. Application Data

[63] Continuation of Ser. No. 837,877, Mar. 5, 1986, abandoned, which is a continuation of Ser. No. 645,181, Aug. 29, 1984, abandoned.

[51] Int. Cl.$^4$ .............................................. H01L 27/12
[52] U.S. Cl. ........................................ 357/4; 357/30; 357/68
[58] Field of Search ................. 357/4, 30, 68; 427/86, 427/87; 448/175; 29/576 E, 572

[56] References Cited

U.S. PATENT DOCUMENTS

| | | | |
|---|---|---|---|
| 3,121,809 | 2/1964 | Atolla | 357/4 |
| 3,459,391 | 8/1969 | Haynos | |
| 4,088,515 | 5/1978 | Blakeslee | 357/4 X |
| 4,179,702 | 12/1979 | Lamorte | |
| 4,261,771 | 4/1981 | Dingle et al. | 357/4 X |
| 4,272,641 | 6/1981 | Hanak | |
| 4,278,474 | 7/1981 | Blakeslee et al. | |
| 4,316,049 | 2/1982 | Hanak | 136/249 |
| 4,323,719 | 4/1982 | Green | |
| 4,330,182 | 5/1982 | Coleman | 357/2 |
| 4,340,803 | 7/1982 | Coyle | |
| 4,387,265 | 6/1983 | Dolal | 357/30 X |
| 4,536,607 | 8/1985 | Weismann | 357/30 |

FOREIGN PATENT DOCUMENTS

56-61-173 10/1979 Japan .

OTHER PUBLICATIONS

R. D. Dupuis, et al., "Stacked Multiple-Bandgap Solar Cells Prepared by CVD Techniques", IEEE, May 1980.
S. M. Sze, "Physics of Semiconductor Devices", vol. I, Wiley, Interscience, N.Y., 1969, p. 416.
A. G. Milnes and D. L. Feucht, "Heterojunctions and Metal-Semiconductor Junctions", p. 288, Academic Press, N.Y., 1972.
L. M. Fraas, "A Shorting Junction for Monolithic Multicolor Solar Cells", Proc. 15th IEEE Photovoltaic Specialists Conf., Orlando, Fla., May 1981, pp. 1353-1356.
Ludowise et al., "High-Efficiency Organometallic Vapor Phase Epitaxy AlGaAs/GaAs Monolithic Cascade Solar Cell Using Metal Interconnects", Appl. Phys. Lett., 41 (6), Sep. 15, 1982, pp. 550-552.
Bedair et al., "AlGaAs/GaAs Efficiency Cascade Solar Cells", Proc. 15th IEEE Photovoltaic Specialists Conf., Orlando, Fla., May 1981, pp. 21-26.
Miller et al., "GaAs-AlGaAs Tunnel Junctions for Multigap Cascade Solar Cells", J. Appl. Phys., 53(1), Jan. 1982, pp. 744-748.
L. M. Fraas et al., "Design of Multijunction Solar Cells", 13th IEEE Photovoltaic Specialists Conf., Washington, D.C., Jun. 5-8, 1978.
B.-Y. Tsaur et al., "GaAs/Ge/Si Solar Cells", Paper #2, Session #4B, 17th IEEE Photovoltaic Specialists Conf., Orlando, Fla., May 1-4, 1984, (Abstract).
J. C. C. Fan, "High Efficiency, Thin Film and Multijunction Solar Cells", Final Rpt. Contract XE-2-02071, Solar Energy Research Institute, (Dec. 82), pp. 15-19.
B. L. Sharma, "Ohmic Contacts to III-V Compound Semiconductors," Semiconductors and Semimetals, vol. 15, R. K. Willardson and A. C. Beer, Eds, (Academic Press, N.Y., 1981, pp. 14, 15.

Primary Examiner—Martin H. Edlow
Attorney, Agent, or Firm—Stanley Z. Cole; Gerald M. Fisher; Kenneth L. Warsh

[57] ABSTRACT

In order to increase the efficiency of solar cells, a monolithic stacked device is constructed comprising a plurality of solar sub-cells adjusted for different bands of radiation. The interconnection between these sub-cells has been a significant technical problem. The invention provides an interconnection which is a thin layer of high ohmic conductance material formed between the sub-cells. Such a layer tends to form beads which serve as a shorting interconnect while passing a large fraction of the radiation to the lower sub-cells and permitting lattice-matching between the sub-cells to be preserved.

23 Claims, 2 Drawing Sheets

HIGH CONDUCTANCE OHMIC JUNCTION FOR MONOLITHIC SEMICONDUCTOR DEVICES

The U.S. Government has rights in this invention pursuant to Contract No. NAS3-22232 between NASA and Varian Associates, Inc.

This application is a continuation of appliation Ser. No. 837,877, filed Mar. 5, 1986, now abandoned, which is a continuation of application Ser. No. 645,181, filed Aug. 29, 1984, now abandoned.

FIELD OF THE INVENTION

This invention pertains to monolithic semiconductor devices having a high ohmic conductance junction between the sub-cells of different spectral sensitivity, and to a method of forming such devices.

BACKGROUND OF THE INVENTION

In order to carry out an efficient conversion of a spectrum of electromagnetic radiation into electrical current, attempts have been made to develop commercial devices called monolithic cascade converters which provide multiple, typically two, semiconductor junctions within one device, one junction having a low characteristic electromagnetic energy gap and the other a high characteristic electromagnetic energy gap. Each of these junctions will be called sub-cells. The energies of the low and high energy gaps are chosen so as to optimize coverage of the incident electromagnetic spectrum, thereby maximizing the efficiency of converting incident electromagnetic radiation into electrical energy. For example, the theoretical maximum efficiency for a two-junction GaAs based device has been calculated to be in excess of 35% near ambient temperature for a typical solar spectrum measured at the earth's surface.

A number of complex connection methods have been proposed for connecting the sub-cells together. One such proposed method is called the metal-interconnected cascade cell, or MICC. See, for example, the paper of Ludowise et al, "High-Efficiency Organometallic Vapor Phase Epitaxy AlGaAs/GaAs Monolithic Cascade Solar Cell Using Metal Interconnects," Appl. Phys. Lett. 41(6) 550-552, 15 Sept. 1982. Metallization schemes such as the MICC involve complex and tedious processing (photolithography, etching, metallization), generally leading to low yields (about 10%) of successfully processed cascades. The extension of this MICC procedure to connect more than two sub-cells in series would involve extremely complex low yield processing and would significantly increase the metal grid shadowing of active cell areas.

Another proposed method of connection uses a germanium interconnect grown between the sub-cells. The low band gap of the Ge is said to permit the facile formation of tunnel junctions in the Ge which would possess the necessary high ohmic conductance. See for example the paper of Fraas, "A Shorting Junction for Monolithic Multicolor Solar Cells," Proc. 15th IEEE Photovoltaic Specialists Conference, Orlando, Fla., May 1981, pp. 1353-1356. The germanium tunnel junction is vulnerable to degradation via dopant diffusion during subsequent high-temperature processing steps. This is illustrated by some calculations by Fraas (Proc. 13th IEEE Photovoltaic Specialists Conference, 1978, Washington, D.C., pp. 886-891). At a p-n tunnel junction, carriers tunnel through a barrier of width W. The junction resistance is extremely sensitive to changes in W; e.g., increasing W by only 20Å increases the resistance by an order of magnitude. For example, a tunnel junction of depletion width 125Å and conductivity 10 A/V-cm$^2$ (sufficient to support a cascade operating at approximately 100 suns concentration, with less than 3% total power loss due to the tunnel junction) degrades to a conductivity of 1 A/V-cm$^2$ at 145Å thickness, and 0.1 A/V-cm$^2$ at 165Å thickness. The 165Å junction will support the cascade only under 1 sun and is too resistive for use under concentration. Further, junction smearing (e.g., by dopant diffusion) will render the junction useless as an interconnect. Unfortunately, this degree of diffusion can occur extremely readily under cascade growth and processing conditions.

The use of highly doped, abrupt junctions (tunnel diodes or backward diodes) to serve as high conductance interconnects has also been described. See for example the paper of Miller et al, "GaAs/AlGaAs Tunnel Junctions for Multigap Cascade Solar Cells," J. Appl. Phys. 53(1) 744-748, Jan. 1982; Bedair et al, "AlGaAs/GaAs High Efficiency Cascade Solar Cells," Proc. 15th IEEE Photovoltaic Specialists Conference, Orlando, Fla., May 1981, pp 21-26. Such highly doped, abrupt junctions have not yet been shown to be stable under cascade growth conditions. The successful use of such junctions requires that the high-conductance III-V characteristic (signifying degenerate doping levels on either side of the junction and an exceedingly abrupt doping profile) be retained during growth of the full cascade. If the Eg of the interconnect material is lower than that of the overlying sub-cell, the interconnect total thickness must be extremely thin ($\leq$125 Angstroms n-type or $\leq$150 Angstroms p-type) in order that it absorb $\leq$3% of the radiation destined for the underlying sub-cell(s). The degradation of high conductance behavior, caused by dopant diffusing during the growth conditions required, for the full cascade, has been virtually impossible to avoid.

The use of superlattices to short junctions via defect tunneling, and thus create a high conductance junction, has been described in theory, but to my knowledge has never actually been constructed. See, for example, U.S. Pat. No. 4,278,474 to Blakeslee, et al. To date no working prototype device exists using a superlattice to actually short out a junction.

Another recent type of cell employs a shorted junction which relies on defect states, but does not use a true superlattice, to short the unwanted junction between a lower Si cell and an upper GaAs cell. The shorting junction functions because of defect tunneling. The defects are introduced via the lattice mismatch between the Si of the lower cell and Ge in the shorting layer. No metal is used in the junction. (See B.Y. Tsaur, et al, Paper #2, Session 4B, 17th IEEE Photovoltaic Specialists Conference, Orlando, Fla., May 1-4, 1984).

The performance of a solar cell is usually described in terms of fill factor, $V_{oc}$ and $I_{sc}$ defined as follows. $V_{oc}$ is the voltage at zero current or open circuit voltage. $I_{sc}$ is the current at zero voltage or at short circuit. The fill factor is a measure of the "squareness" of the power characteristics, and of what fraction of $V_{oc}$ and $I_{sc}$ are contributing to cell power output. If $I_m$ and $V_m$ are the current and voltage at maximum power output, then fill factor is defined as the product of $I_{sc}$ times $V_{oc}$ divided by the product of $I_m$ times $V_m$.

OBJECTS OF THE INVENTION

An object of the invention is to provide a practical, commercial method of forming a multilayered solar cell without the complex and tedious processing steps of so-called MICC method, thereby reducing time and expense of manufacture and improving yields.

A further object is to provide such a method which would be stable under cascade growth conditions.

A further object is to provide such a method which would be much faster and cheaper to use than any other method thereby reducing the cost of the solar cells.

BRIEF SUMMARY OF THE INVENTION

According to the invention a first sub-cell is formed on a substrate. A thin layer of high ohmic conductance material is then formed on the first sub-cell. The term "ohmic" will be used in this specification to encompass true ohmic and quasi-ohmic. (See S.M. Sze, "Physics of Semiconductor Devices", Vol. I, p. 416, Wiley-Interscience, N.Y., 1969, and A.G. Milnes and D.L. Feucht, "Heterojunctions and Metal-Semiconductor Junctions", p. 288., Academic Press, N.Y., 1972.) The second sub-cell is thereafter formed on top of this junction layer. Each sub-cell is lattice-matched to within 0.5% to the substrate. Alternately, if appropriate grading layers are used between the substrate and lower cell, or between the sub-cells, the individual sub-cells do not have to be lattice-matched to either the substrate or to each other. If additional sub-cells are desired, a similar junction layer is used as an interconnect for each pair of sub-cells. All process steps are compatible with fomation and retention of ohmic contact at the interface between each sub-cell and the layer of high ohmic conductance material.

The thin layer of high ohmic conductance material such as indium, gallium, aluminum, etc. with various alloys chosen for bonding characteristics is deposited during device growth. In the preferred embodiment "beading" of the layer of high ohmic conductance material is thought to improve light transmission to the lower sub-cells and preserve lattice-matching to the upper sub-cell. The term "beading" is used herein to mean formation of disconnected regions of high ohmic conductance material whether formed by unconnected nucleation centers in an extremely thin layer or under some influence of surface tension as a liquid in a thicker layer. The monolithic cell produced with this interconnect layer exhibits voltage addition and good fill factors. No additional processing, subsequent to growth, as compared to a single junction device is necessary. In addition, the interconnect has been demonstrated to have high interconnect stability (high ohmic conductance retention) under the conditions required to grow a full cascade cell.

In a preferred embodiment of the method, the device is formed using organometallic vapor phase epitaxy (MOCVD). The nature of the MOCVD process requires that oxygen be excluded from the system. Not only does it react with the transport materials (trimethylgallium, trimethylindium, etc.), but oxygen acts as a carrier trap and recombination center in many semiconductors, degrading device performance. Hence, oxides of indium, for example, would not be deposited in a properly functioning MOCVD system. If the In were put down by an alternate method involving air exposure, the In would oxidize and the interconnect would be degraded.

The structure of this invention appear to create a high conductance junction by a different mechanism as compared to the tunnel junction. I believe this invention shorts the junction by ohmic contacting the p and n sides directly with high ohmic conductance material. The high ohmic conductance material appears to alloy a relatively short distance into the p and n semiconductors; hence dopant diffusion which would ruin an all semiconductor tunnel junction does not appear to degrade this ohmic short.

The invention is a great improvement in the technology of solar cell manufacture. It is simpler than any other method yet disclosed and has been shown by laboratory testing to be rugged and reliable. An increase in the rate of production by about a factor of five to seven has been estimated for the invention over the MICC technique.

These and further constructional and operational characteristics of the invention will be more evident from the detailed description given hereinafter with reference to the figures of the accompanying drawings which illustrate a preferred embodiment and alternatives by way of non-limiting examples.

DETAILED DESCRIPTION OF THE PREFERRED EMBODIMENTS

A. Structure of the Device

Figure 1:
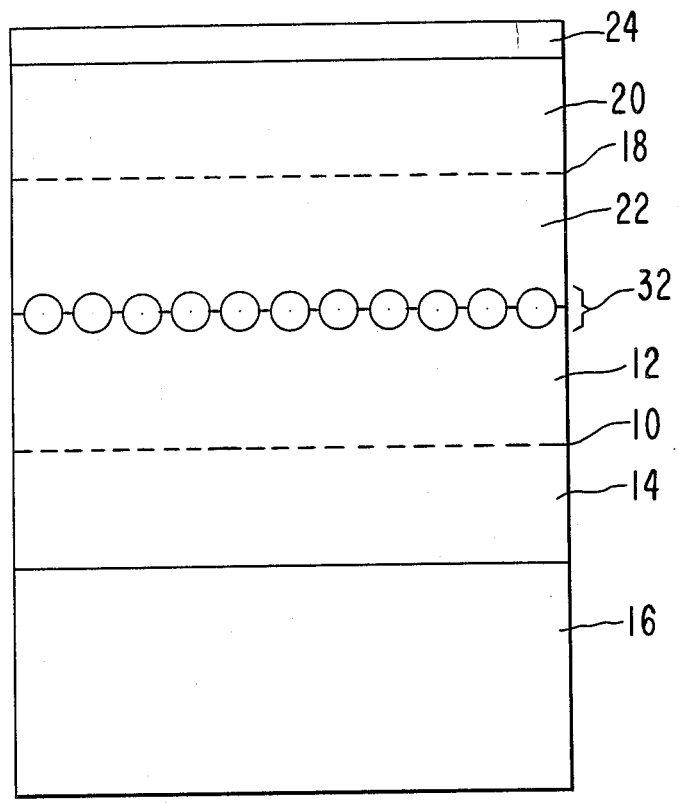
FIG. 1 is a schematic section through a monolithic solar cell showing the interconnect according to the invention.

According to the invention, the shorting junction places a very thin layer of high ohmic conductance material, such as indium, at the desired high-ohmic-conductance interface. In the method of the invention, doping or alloying of the high ohmic conductance material may be done during its deposition and it appears to improve the ohmic contact. Alternately, if the dopants in the adjacent III-V layers possess sufficiently high diffusion coefficients, they will diffuse into the high ohmic conductance material during growth. Additional intentional doping of the layer of high ohmic conductance material is optional. An example of a n/p interconnect linking two p/n sub-cells is illustrated in FIG. 1. Again a first sub-cell having junction 10 with upper p/n layer 12 and lower n/p layer 14 is formed on substrate 16. A second sub-cell having junction 18, upper p/n layer 20, lower n/p layer 22 and window and cap layer 24 is connected to the first sub-cell by a shorting interconnecting layer of high ohmic conductance material 32, for example, indium. In the instance where the semiconductor is GaAs, the highly doped GaAs immediately adjacent to the In permits p- and n-dopant diffusion into the In. Multiple interconnects can be used to link a larger number of sub-cells than the two illustrated here. All sub-cells are lattice-matched to the substrate to within 0.5%. Alternately, if appropriate grading layers are used between the substrate and lower cell, or between the sub-cells, the individual sub-cells do not have to be lattice-matched to either the substrate or to each other.

Junction layers of metal of average thickness 10Å to 50Å have been particularly successful. However, there is no reason to believe that layers of somewhat lesser or greater thickness would not also work.

Figure 2:
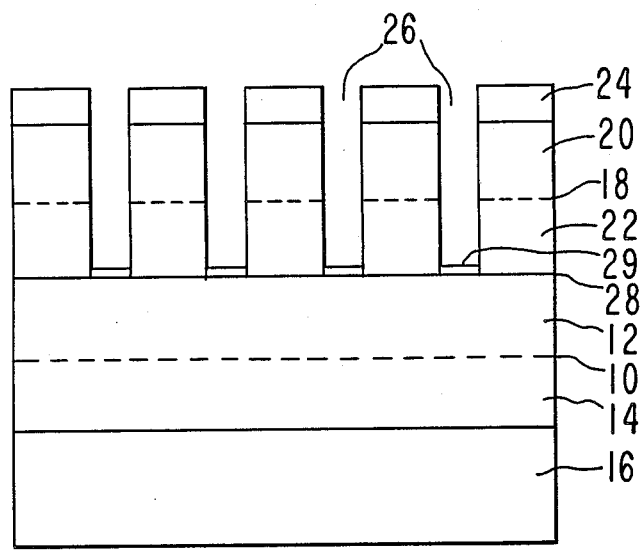
FIG. 2 is a schematic section through a monolithic solar cell showing the metal-interconnect-cascade-cell of the prior art.

In contrast, prior art is shown in FIG. 2 as a schematic section through a monolithic solar cell showing the metal-interconnect cascade cell. The first sub-cell with junction 10 having upper p/n layer 12 and lower n/p layer 14 is shown on substrate 16. The second sub-cell has junction 18 with upper p/n layer 20 and lower n/p layer 22. On top of the cell are window and cap layers 24. Narrow metallization channels 26 are formed through the window; and cap layers 24, the upper 20 and lower 22 layers of the second sub-cell to the interface 28. Metal is deposited at the bottom 29 of the channel 26 at the interface 28.

Figure 3:
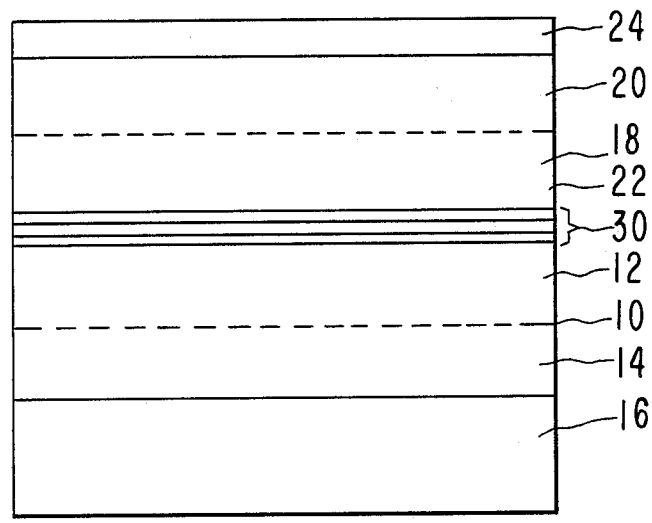
FIG. 3 is a schematic section through a monolithic solar cell showing the superlattice interconnection of the prior art.

In FIG. 3, a schematic section of a solar cell with the proposed superlattice interconnection of the prior art is shown. Again, the first sub-cell with junction 10 having upper p/n layer 12 and lower n/p layer 24 is shown on substrate 16. The second sub-cell has junction 18 with upper p/n layer 20, lower n/p layer 22, and window and cap layers 24. The superlattice 30 is shown as a series of layers between the first and second sub-cells.

B. Advantages of the Structure of the Invention

From comparison of these Figures, it can be seen that the structure of the metal interconnect of the invention is much simpler than the other structures and hence, requires fewer steps in fabrication at a great saving of time and expense.

The invention is very versatile and can be adapted to a III-V semiconductor materials system or other systems. Individual solar cells in a wide variety of other materials systems are known. Some of these cells are constructed from other classes of semiconductors (II-VI systems, I-III-VI$_2$ systems, etc., where the Roman numeral refers to the column of the Periodic Table in which the relevant element is located) or combinations of such classes (e.g., containing more than one such class within the cell). Other cells contain other types of junctions: e.g., semiconductor-metal; organic semiconductors in combination with other organic semiconductors, inorganic semiconductors, or metals. I believe the inventive structure is also applicable to polycrystalline and amorphous cell materials (as well as single-crystal). This structure seems especially suitable for cells of amorphous silicon.

The device of the invention, as hereinbefore described, deals with the application of the high ohmic conductance interconnection in a cascade solar cell or photovoltaic converter. The high ohmic conductance interconnection could also be applied to other devices in which its presence were necessary to short out any unwanted junctions in the structure. Such an application might either be necessary for proper performance of the device, or might be useful in selective testing of the components of a crmplex multilayer structure under the conditions required for growth of the whole. Examples of other optoelectronic sub-devices besides solar cells which might be used in a monolithic device are lasers, LED's, and optical modulators.

If the layer of high ohmic conductance material is sufficiently thin, it will not reflect or absorb a significant fraction of the light destined for the underlying cell(s). This permits series operation of the sub-cells and yields a functioning monolithic cascade.

The low resistance of the interconnect enhances such important cascade parameters as $V_{oc}$, $I_{sc}$ and fill factor.

C. Testing of the Device

To date, I have grown more than 150 assorted test structures, related to the interconnecting junctions of interest. These include: isolated interconnecting junctions, interconnecting junctions grown under cascade growth conditions, and combinations of GaAs cells and AlGaAs cells with the interconnecting junctions. The interconnection reproducibility demonstrates viability of the concept through a wide range of varying experimental conditions designed to improve and optimize the structures.

The prototype interconnecting structures are routinely tested under the same conditions and using the same equipment used in these laboratories for diodes and single-junction cells. No degradation due to processing, handling, or the passage of time has been observed. The techniques for processing a final device are the same as those used in the processing of single-junction cells, which have been demonstrated in these laboratories to be reliable and reproducible.

TEST EXAMPLE 1

(Performance of Cells Beneath High Conductance Layer)

A GaAs cell was grown on a GaAs substrate, followed by the intermediate high-conductance layer of In or Ga, then a high-bandgap (1.6 to 1.8 eV) layer of GaAs, an upper window and finally, a top contact. The regions grown after the high-conductance layer are grown under conditions which approximate the time, temperature, materials and conditions which would be required to grow an upper cell (such as AlGaAs). However, no junction is present in the upper region, so that the lower region is the only photoactive region. The high conductance layer of In or other metal is sandwiched between 800Å of underlying AlGaAs and 800Å of overlying GaAs. I observe 10% decrease in lower region cell internal quantum efficiencies in these tests, as compared to totally unobscured cells. This 10% loss is believed entirely attributable to the absorptivity of the top 800Å of GaAs, and hence, the In metal layer is not believed to be contributing appreciably to any losses in efficiency by process. This test was repeated several times with the same results.

TEST EXAMPLE 2

(Quality of Overlying Material)

High-efficiency GaAs cells have been routinely grown atop the high-conductance layers made according to this invention on top of a single crystal CaAs cell. These cells all have high internal quantum efficiencies, high photoluminescence efficiencies and specularly reflective surfaces; these parameters all indicate good crystal quality. The cell parameters, in fact, are virtually indistinguishable from those of comparable GaAs cells grown directly upon single crystal GaAs substrates with the same processes. Because the lattice constants and crystal structures of the In metal and the GaAs semiconductor differ drastically, it is believed that it would be extremely difficult, if not impossible, to grow high-quality single-crystal GaAs atop a continuous In film.

D. Theory of Operation of the Device

The invention is thought to work by low resistance ohmic contacting of both upper and lower subcells, hence eliminating or by-passing the depletion region and diode effect which normally takes place when p-type material is grown on n-type material.

The interconnecting high ohmic conductance layer is extremely thin. High-quality semiconductor material is routinely grown atop it. If the high ohmic conductance material were being deposited as a continuous film, it is expected the following would be observed:

1. Cells underneath the high ohmic conductance layer would receive much less illumination and would test poorly, since continuous thin (approximately 50Å) high ohmic conductance layers normally possess high reflectances and optical absorptivities. In my tests, however, I observe good performance from these cells.

2. The semiconductor material grown atop the high ohmic conductance material would be expected to be damaged substantially due to a large number of lattice defects being introduced at the semiconductor/high-ohmic-conductance layer interfaces, which would be expected from nucleating single-crystal semiconductor atop a high ohmic conductance layer of different crystal structure. In reality, however, no such extensive damage is observed.

It therefore is postulated that the high ohmic conductance layer is being deposited as small "beads", which might be nucleation centers which have not grown together in the thinnest layers or drops held together by the surface tension of the metal in the thicker layers. Gallium and indium are both liquid at the growth temperatures used, but this may not be important. Upon completion of metal deposition, semiconductor deposition is reinstituted. It is believed that growth proceeds initially in the areas not covered by the high ohmic conductance material, and eventually the semiconductor laterally overgrows the high ohmic conductance material. Single crystallinity and good semiconductor quality are retained.

It is not deemed necessary to have a continuous layer of high ohmic conductance material in order to cause the interconnecting junction to short. The situation might be similar to that used in the MICC device; if the high ohmic conductance areas are sufficiently closely spaced as to be accessible to carriers, only a relatively small percentage of the junction need be physically shorted. The high ohmic conductance layer is kept sufficiently thin as to:

1. absorb negligible light destined for lower sub-cells;
2. reflect negligible light destined for the lower sub-cells; and
3. not interfere with the growth of overlying high-quality material.

The lower the fraction of the junction actually covered by high ohmic conductance material, the thicker the high ohmic conductance layer can be, as long as the above three criteria are met.

E. Other Embodiments of the Device

The high ohmic conductance layer can be laid down as successive sublayers of different composition to provide better ohmic contacting to the semiconductor layers above and below. Different materials (or combinations of materials) can be used to short out the interconnecting junction in a manner analogous to that of the indium, i.e., by ohmic contacting of the adjacent layers, with or without supplementary defect tunneling. An example is the use of a different metal or alloy which can ohmic contact the adjacent semiconductor layer; or the successive deposition of several metal or alloy layers, in which the lowermost ohmic contacts the lower semiconductor and the uppermost ohmic contacts the upper semiconductor (the metal layers ohmic contact each other). In some cases, the shorting material must be doped in order to effectively ohmic contact the adjacent semiconductor layers. Undoped In can effectively ohmic contact n-type GaAs (although n-doping of the In enhances the contact), but p-doping of the In is necessary for it to effectively contact p-type GaAs. Undoped Ga can ohmic contact p-GaAs (although p-doping of the Ga enhances the contact), but n-doping of the Ga is necessary for it to effectively ohmic contact n-GaAs. (See B.L. Sharma, "Ohmic Contacts to III-V Compound Semiconductors", pp. 1–38, in *Semiconductors and Semimetals,* ed. R.K. Willardson and A.C. Beer, Vol. 15, Academic Press, N.Y., 1981.) Thus, the invention can be practiced using either Ga or In as the shorting metal, and n-doping of the shorting metal. The interconnect will work without this deliberate doping, if there is sufficiently high doping in the adjacent semiconductor layers to permit a good ohmic contact to be made. However, deliberate addition of dopant to the metal provides a relatively large reservoir of dopant which can diffuse into the semiconductor creating a desired highly-doped region adjacent to the metal. This may be more facile under some conditions than doping the semiconductor alone. The same semiconductor need not be used on both the p- and n- sides of the interconnection. For example, interconnecting junctions are possible containing p-AlGaAs and n-GaAs, or p—$Al_xGa_{1-x}As$ and n—$Al_yGa_{1-y}As$ ($x \neq y$), adjacent to the shorting material.

The invention can contain GaAs sub-cells grown upon a GaAs substrate. Alternatively, III-V ternary or quaternary semiconductors could be substituted for the GaAs sub-cells, for example, AlGaAs, GaInAs, GaAsP, AlGaAsP, etc. This would create an analogous cascade device, but one with somewhat different optical and electronic properties than the all-GaAs one. In any cascade, the sub-cells would be required to be of different bandgaps (the higher-bandgap sub-cells uppermost, assuming illumination from the top), in order that all the sub-cells contribute to utilization of the incident light.

Note that the shorting junction should not absorb a significant amount of light destined for lower sub-cells. If the bandgap of the semiconductor(s) dopant used in the shorting junction equals or exceeds the bandgap of the immediately overlying cell, there is no degradation. If the bandgap of the dopant semiconductor(s) in the shorting junction is lower, however, it is very advantageous to keep the layers of the shorting junction very thin, so that it absorbs only a small amount of light.

The use of alternate substrates, such as InAs, InP, GaP, etc., is also possible. The selection of substrate for solar cells usually is influenced by the choice of sub-cell materials, their lattice constants, bandgaps, thermal stabilities, etc.

In an alternative embodiment on p sub-cells may be substituted for p on n sub-cells, or vice-versa as long as the type of cell alternates appropriately. The primary type of the interconnect would, of course, be adjusted also as described above.

I believe that metal-silicides would also be useful high ohmic conductance material in a cell using amorphous silicon.

F. Example of the Method

In the preferred embodiment of the method, a monolithic cascade solar cell was made by organometallic vapor phase epitaxy, also known as metalorganic chemical vapor deposition (MOCVD). The system consisted of a stainless steel gas-handling system attached to a quartz reactor tube. The liquid and solid sources (transport agents) were contained in stainless steel or glass bubblers or sublimers, attached to the gas-handling system, with appropriate valves between the sources and the main system lines. Gaseous sources were prediluted with hydrogen and stored in compressed gas cylinders, with appropriate valves between the sources and the main system lines. Electronic mass flow controllers were used to regulate the gas flows.

A typical substrate wafer of GaAs was solvent cleaned with solvents such as acetone, tri-chloroethylene, or isopropanol, then etched with a mixture 8:1:1 by volume comprising concentrated sulfuric acid, 30% hydrogen peroxide in water, and water, then rinsed in deionized water and then dried under a filtered nitrogen stream. The wafer was loaded onto a silicon-carbide-coated graphite block, which was placed into the quartz reactor tube. The tube was closed and purged with pure hydrogen carried gas for 30 minutes. The substrate was then heated via the rf coils placed around the middle of the reactor and enveloping the graphite block. The growth temperature was monitored via a thermocouple inserted into a well in the graphite block and through a feedthrough in the quartz reactor tube. The carrier gas flow was maintained during the purge and growth run at 8 liters/min. When the substrate temperature reached approximately 200° C., the arsine flow over the wafer at approximately 125 cm$^3$/min was started, to prevent arsenic from evaporating from the hot wafer surface and degrading its morphology.

The wafer was heated to 880° C. over a 10-minute period and held at 880° C. for 2 minutes to remove surface oxides. The wafer was then cooled to the starting growth temperature, over a 5-minute period. GaAs was typically grown at 730° C. For other materials, optimum growth temperatures varied between 600° C. and 800° C. By opening appropriate inlet and outlet valves on the liquid or solid organometallic source cylinders and closing the corresponding bypass valves, appropriate carrier gas streams saturated with organometallic source vapors were set up and injected into the reactor. Gaseous sources were prediluted in hydrogen and the hydrogen mixture injected into the reactor. The vapors were copyrolyzed in the reactor hot zone, leading to deposition. For example: To deposit zinc-doped GaAs, a mixture of trimethylgallium, diethylzinc and arsine in hydrogen was mixed and flowed over the wafer. Typical mole fractions for the growth of such GaAs with Zn doping level approximately $6 \times 10^{-4}$/cm$^3$ at 5 micrometers/hr were: trimethylgallium, $1.4 \times 10^{-4}$; arsine, $1.4 \times 10^{-3}$; diethylzinc, $1 \times 10^{-6}$. In one particular reactor, these mole fractions had corresponding source temperatures and carrier gas flow rates of trimethylgallium, 24.4 cm$^3$/min, source at $-11°$ C.; diethylzinc, 2 cm$^3$min, source at 0° C.; arsine, 122 cm$^3$min, prediluted mixture of 10% arsine in hydrogen.

To deposit layers of different materials, the appropriate system valves were opened and closed, and the gas flows adjusted in accordance with the desired material composition. The overall growth rate was approximately 5 micrometers/hr; several hours would be required for a typical growth. After growth was complete, the wafer was cooled down, under a flow of hydrogen and arsine. The arsine flow was stopped when the temperature of the wafer reached 200° C.; the carrier gas flow was maintained down to room temperature. The reactor was then opened and the wafer removed.

Other transport agents used in this system included trimethylindium (for In), trimethylaluminum (for Al) and hydrogen selenide (for Se). An average layer thickness of 10 Angstroms to 50 Angstroms produced an effective interconnect using indium. The indium of the interconnect was deposited by admitting the transport agent, trimethylindium, to the reaction chamber while interrupting the arsine flow. The indium deposition thus preferably should occur over a short period of time ($\leq 30$ sec) to minimize thermal degradation of the underlying surface.

The purity of the high ohmic conductance material should be comparable to that of the semiconductor materials used in the cell, in order that the interconnecting junction be compatible with them. Typical purities of transport agents used in this growth technique is 99.999% (analysis by atomic absorption spectrometry, with special concern for low transition metal levels).

G. Advantages of the Method

It can be seen from the foregoing example that the formation of a monolithic solar cell by the method of forming a high ohmic conductance layer between the sub-cells according to the invention is a faster and simpler, and thus, more reliable, and higher yield method than the MICC method. In addition, the devices so formed are more reliable, rugged and inexpensive device than in the prior art.

Relative to MICC and derivative configrations which short the undesired junction by metallization during processing, the processing time is reduced significantly. Because the processing is simpler the yields are significantly higher than for MICC structures. The invention renders a cascade far more amenable to scale-up in production and enhances reproducibility of behavior.

Relative to tunnel junctions, the ohmic contact is more stable under the conditidns required for growth of a cascade cell and is relatively insensitive to degradation caused by dopant diffusion or interface smearing during cascade growth. By contrast, tunnel diodes degrade into rectifying diodes under comparable conditions, leading to highly resistive interconnects and poorly performing cascades. The concept of a superlattice to short a junction via defect tunneling has not yet been physically demonstrated; the junctions are still rectifying. Moreover, the high ohmic conductance layer is inherently simpler and cheaper than the superlattice.

This invention is not limited to the preferred embodiment and alternatives heretofore described, to which variations and improvements may be made, without leaving the scope of protection of the present patent, the characteristics of which are summarized in the following claims.

What is claimed is:

1. A monolithic photovoltaic semiconductor device including sub-devices of different radiation converting bandgaps, comprising:

a substantially single-crystalline substrate of composition such that layers subsequently-formed thereon can be lattice-matched thereto;

a lower sub-device of substantially single-crystalline material having a first bandgap overlying said substrate;

an upper sub-device of substantially single-crystalline material having a second bandgap overlying said lower sub-device; and interconnection means for forming an ohmic interconnection between said upper sub-device and said lower sub-device, said interconnection means including an ultra-thin layer of high conductance metal, said layer being substantially disconnected bead-like bodies of metal, said bead-like bodies being on the average to within an order of magnitude the same size in any direction, said ultra-thin layer being interposed between and in ohmic contact with both said sub-devices, said ultra-thin layer being substantially transparent to wavelengths of radiation matching said first bandgap.

2. A monolithic semiconductor device as in claim 1 wherein said lower sub-device is lattice-matched to said substrate, said upper sub-device is lattice-matched to said lower sub-device, and said ultra-thin layer of high conductance metal is sufficiently disconnected to permit lattice-matching of said upper sub-device to said lower sub-device.

3. A monolithic semiconductor device as in claim 1 wherein said ultra-thin layer of high conductance metal is of average thickness no less than 10Å and no more than 50Å.

4. A monolithic semiconductor device including optoelectronic sub-devices of different radiation converting bandgaps, comprising:
 a substrate of composition such that layers can be deposited thereon and lattice-matched thereto;
 a lower optoelectronic sub-device of stoichiometric composition having a first bandgap formed on said substrate;
 an upper optoelectronic sub-device of stoichiometric composition having a second bandgap formed on said lower optoelectronic sub-device; and
 interconnection means for forming an ohmic interconnection between said upper sub-device and said lower sub-device, said interconnection means including an ultra-thin layer of high conductance metal interconnecting said optoelectronic sub-devices, said layer being substantially disconnected bead-like bodies of metal, said bead-like bodies being on the average to within an order of magnitude the same size in any direction, said layer being substantially transparent to wavelengths of radiation matching said first bandgap.

5. A monolithic semiconductor device as in claim 4 wherein said lower optoelectronic sub-device is lattice-matched to said substrate, said upper optoelectronic sub-device is lattice-matched to said lower optoelectronic sub-device, and said ultra-thin layer of high conductance metal is sufficiently disconnected to permit lattice-matching of said upper optoelectronic sub-device to said lower optoelectronic sub-device.

6. A monolithic semiconductor device as in claim 4 wherein said ultra-thin layer of high conductance metal comprises a substantial plurality of substantially disconnected beads of metal.

7. A monolithic semiconductor device as in claim 6 wherein said ultra-thin layer of high conductance metal is of average thickness no less than 10Å and no more than 50Å.

8. A semiconductor monolithic cascade radiation-converting solar cell including sub-cells of different bandgaps, comprising:

a substrate of composition suitable for lattice-matching to other layers;
 a lower radiation-converting semiconductor solar sub-cell of III-V material formed on said substrate;
 an upper radiation-converting semiconductor solar sub-cell of III-V material formed on said lower radiation-converting semiconductor solar sub-cell; and
 interconnection means for forming an ohmic interconnection between said lower sub-cell and said upper sub-cell, said interconnection means including an ultra-thin layer of high conductance metal interconnecting said sub-cells, said layer being substantially disconnected bead-like bodies of metal, said bead-like bodies being on the average to within an order of magnitude the same size in any direction, said layer being substantially transparent to wavelengths of radiation having frequency matching the bandgap of said lower sub-cell.

9. A semiconductor monolithic cascade radiation-converting solar cell as in claim 8 wherein said lower radiation-converting semiconductor solar sub-cell is lattice-matched to said substrate, said upper radiation-converting semiconductor solar sub-cell is lattice-matched to said lower radiation-converting semiconductor solar sub-cell and said ultra-thin layer of high conductance metal is sufficiently disconnected to permit lattice-matching of said upper radiation-converting semiconductor solar sub-cell to said lower radiation-converting semiconductor solar sub-cell.

10. A semiconductor monolithic cascade solar cell as in claim 8 where said ultra-thin layer of high conductance metal comprises indium.

11. A semiconductor monolithic cascade solar cell as in claim 8 where said ultra-thin layer of high conductance metal comprises gallium.

12. A semiconductor molithic cascade solar cell as in claim 8 where said ultra-thin layer of high conductance metal comprises aluminum.

13. A semiconductor monolithic cascade radiation-converting solar cell as in any one of claims 8 through 12 wherein said ultra-thin layer of high conductance metal comprises a multiplicity of disconnected beads of metal of average thickness no less than 10Å and no more than 50Å.

14. A monolithic semiconductor device including subdevices of different radiation-converting bandgaps, comprising:
 a substrate of substantially single-crystalline material;
 a lower sub-device of substantially single-crystalline material having a first bandgap overlying said substrate;
 an upper sub-device of substantially single-crystalline material having a second bandgap overlying said lower sub-device; and
 interconnection means intermediate said first and second sub-devices for ohmic shorting a depletion layer between said upper sub-device and said lower sub-device without penetrating said upper subdevice, said interconnection means being an ultra-thin layer of high conductance metal, said means being substantially disconnected bead-like bodies of metal, said bead-like bodies being on the average to within an order of magnitude the same size in any direction, said means being substantially transparent to wavelengths of radiation substantially near said first bandgap of said lower sub-device.

15. A monolithic semiconductor device as in claim 14 wherein said lower sub-device is lattice-matched to said substrate, said upper sub-device is lattice-matched to said lower sub-device, and said means for ohmic shorting includes means to avoid disrupting said lattice-matching of said upper sub-device to said lower sub-device.

16. A monolithic semiconductor device as in any one of claims 14 or 15 wherein said means for ohmic shorting is of average thickness no less than 10Å and no more than 50Å.

17. An electric device including materials of different radiation converting bandgaps, comprising:
- a substantially single-crystalline substrate of composition suitable for lattice-matching to other layers;
- a first substantially single-crystalline material having a first bandgap on said substrate;
- a second substantially single-crystalline material having a second bandgap; and
- interconnection means for forming an ohmic interconnection between said first material and said second material, said interconnection means including an ultra-thin layer of high conductance metal intermediate and in contact with said first and second materials, said layer being substantially disconnected bead-like bodies of metal, said bead-like bodies being on the average within an order of magnitude the same size in any direction, said layer being substantially transparent to wavelengths of radiation matching said first bandgap, said layer being thin enough to permit said first and second materials to be lattice-matched in a monolithic device.

18. An improved monolithic semiconductor cascade device defining at least a first semiconductor photocell on a substantially single-crystalline substrate and a second semiconductor photocell on the first, the first and second photocells being lattice-matched within 0.5% to each other and to the substrate, wherein the improvement comprises:
- an interconnecting ultra-thin layer of metal between said photocells and in ohmic contact with both said photocells, said layer being substantially disconnected bead-like bodies of metal, said layer being substantially transparent to wavelengths of light to which the first photocell is sensitive.

19. An improved monolithic semiconductor cascade device as in claim 17 wherein said ultra-thin high conductance metal layer is of average thickness no less than 10Å and no more than 50Å.

20. An improved monolithic semiconductor cascade device as in claim 19 wherein said ultra-thin high conductance metal layer comprises indium.

21. An improved monolithic semiconductor cascade device as in claim 20 wherein said ultra-thin high conductance metal layer comprises gallium.

22. An improved monolithic semiconductor cascase device as in claim 21 wherein said ultra-thin high conductance metal layer comprises aluminum.

23. An improved monolithic semiconductor cascade device as in any one of claims 18 through 22 wherein said ultra-thin high conductance metal layer comprises a substantial plurality of disconnected beads of metal.

* * * * *